United States Patent
Tsuiji

(10) Patent No.: US 9,419,787 B2
(45) Date of Patent: Aug. 16, 2016

(54) CDR CIRCUIT AND SEMICONDUCTOR DEVICE

(71) Applicant: Synaptics Display Devices GK, Nakano-Ku, Tokyo (JP)

(72) Inventor: Kosuke Tsuiji, Tokyo (JP)

(73) Assignee: Synaptics Display Devices GK, Tokyo (JP)

(*) Notice: Subject to any disclaimer, the term of this patent is extended or adjusted under 35 U.S.C. 154(b) by 0 days.

(21) Appl. No.: 14/791,578

(22) Filed: Jul. 6, 2015

(65) Prior Publication Data

US 2016/0013928 A1    Jan. 14, 2016

(30) Foreign Application Priority Data

Jul. 14, 2014  (JP) .................................. 2014-144120

(51) Int. Cl.
| | |
|---|---|
| *H04L 7/033* | (2006.01) |
| *H04L 7/04* | (2006.01) |
| *H03L 7/07* | (2006.01) |
| *H03L 7/08* | (2006.01) |
| *H03L 7/081* | (2006.01) |

(52) U.S. Cl.
CPC ................ *H04L 7/0331* (2013.01); *H03L 7/07* (2013.01); *H03L 7/08* (2013.01); *H03L 7/0807* (2013.01); *H03L 7/0812* (2013.01); *H04L 7/041* (2013.01)

(58) Field of Classification Search
CPC ............... H03L 7/06; H03L 7/07; H03L 7/08; H03L 7/0807; H03L 7/0812; H03L 7/087; H03L 7/091; H03L 7/16; H04L 7/033; H04L 7/0331; H04L 7/0334; H04L 7/04; H04L 7/041; H04L 7/044; H04L 7/08; H04L 7/10

USPC .......... 375/326, 327, 371, 373, 376; 327/142, 327/144–147, 155, 156

See application file for complete search history.

(56) References Cited

U.S. PATENT DOCUMENTS

| | | | | |
|---|---|---|---|---|
| 5,666,341 A | * | 9/1997 | Horibe .................. | G11B 19/12 360/51 |
| 6,792,063 B1 | * | 9/2004 | Ogura .............. | G11B 20/10009 327/159 |
| 2009/0060107 A1 | * | 3/2009 | Fischer .................... | H04L 7/08 375/355 |
| 2016/0013929 A1 | * | 1/2016 | Takanashi ............. | H04L 7/0332 375/375 |

FOREIGN PATENT DOCUMENTS

JP           2012-044446 A       3/2012

* cited by examiner

*Primary Examiner* — Young T Tse
(74) *Attorney, Agent, or Firm* — Patterson + Sheridan, LLP

(57) ABSTRACT

A clock data recovery (CDR) circuit includes a sampling circuit, a synchronization circuit that synchronizes a frequency of an oscillation clock signal from an oscillation circuit with a frequency of input data of a specific pattern which is sampled in the sampling circuit, and synchronizes a phase of the oscillation clock signal with a phase of the sampled input data, and a data pattern recognition circuit that detects whether the input data sampled in the sampling circuit has a specific pattern. The data pattern recognition circuit starts an operation for detecting whether the input data has a specific pattern in response to a frequency lock start instruction. The synchronization circuit starts an operation for synchronizing the frequency on condition that it is determined by the data pattern recognition circuit that the input data has a specific pattern.

20 Claims, 14 Drawing Sheets

CDR CIRCUIT AND SEMICONDUCTOR DEVICE

CROSS-REFERENCE TO RELATED APPLICATIONS

The present application claims priority from Japanese application JP 2014-144120 filed on Jul. 14, 2014, the content of which is hereby incorporated by reference into this application.

BACKGROUND

The disclosure relates to a clock data recovery (CDR) circuit having a function of reproducing a clock signal from data having a clock signal embedded in a data row, and relates to, for example, a technique effective in a case of application to a data input interface circuit using a CDR circuit in which a specific data pattern is used for frequency lock.

In a display driving device that performs display driving of a liquid crystal display (LCD) or the like, the speeds required of a data input interface circuit have increased corresponding to increases in the high definition of the display. A CDR circuit can be used as part of a clock-embedded data input interface for high-speed transmission.

In one example, JP-A-2012-44446 discloses a clock data recovery circuit that generates and outputs a clock signal for extracting data from a data signal transmitted in a serial manner, and that includes a frequency-locked loop for locking the clock signal to a desired frequency using a predetermined reference clock signal, and a phase-locked loop for phase-synchronizing the clock signal with the data signal in the locked state of the clock signal. Frequency comparison of the reference clock signal with the clock signal is performed during an operation of the frequency-locked loop, a clock signal is generated having a frequency according to the comparison result, and the phases of the generated clock signal and data are synchronized by bringing the phase-locked loop into operation.

SUMMARY

In one embodiment, a clock data recovery (CDR) circuit is disclosed that includes a sampling circuit configured to sample input data, and a data pattern recognition circuit configured to determine, upon receiving a frequency lock start instruction, whether sampled input data includes a predetermined pattern. The CDR circuit further includes a synchronization circuit configured to synchronize a frequency of a received oscillation clock signal with a frequency of sampled input data that includes the predetermined pattern, and to synchronize a phase of the oscillation clock signal with a phase of the sampled input data.

In another embodiment, a semiconductor device is disclosed that includes external interface circuitry configured to receive input data from a transmission device. The external interface circuitry includes a clock data recovery (CDR) circuit comprising a sampling circuit configured to sample received input data and a data pattern recognition circuit configured to determine, upon receiving a frequency lock start instruction, whether sampled input data includes a predetermined pattern. The CDR circuit further comprises a synchronization circuit configured to synchronize a frequency of a received oscillation clock signal with a frequency of sampled input data that is determined by the data pattern recognition circuit to include the predetermined pattern, and to synchronize a phase of the oscillation clock signal with a phase of the sampled input data. The semiconductor device further includes processing circuitry configured to process the received input data.

In another embodiment, a method of performing clock data recovery for received input data is disclosed. The method includes sampling the input data, and determining, upon receiving an instruction to begin frequency synchronization, whether the sampled input data includes a predetermined pattern. The method further includes synchronizing a frequency of a received oscillation clock signal with a frequency of sampled input data that includes the predetermined pattern, and synchronizing a phase of the oscillation clock signal with a phase of the sampled input data.

DETAILED DESCRIPTION

Figure 1:
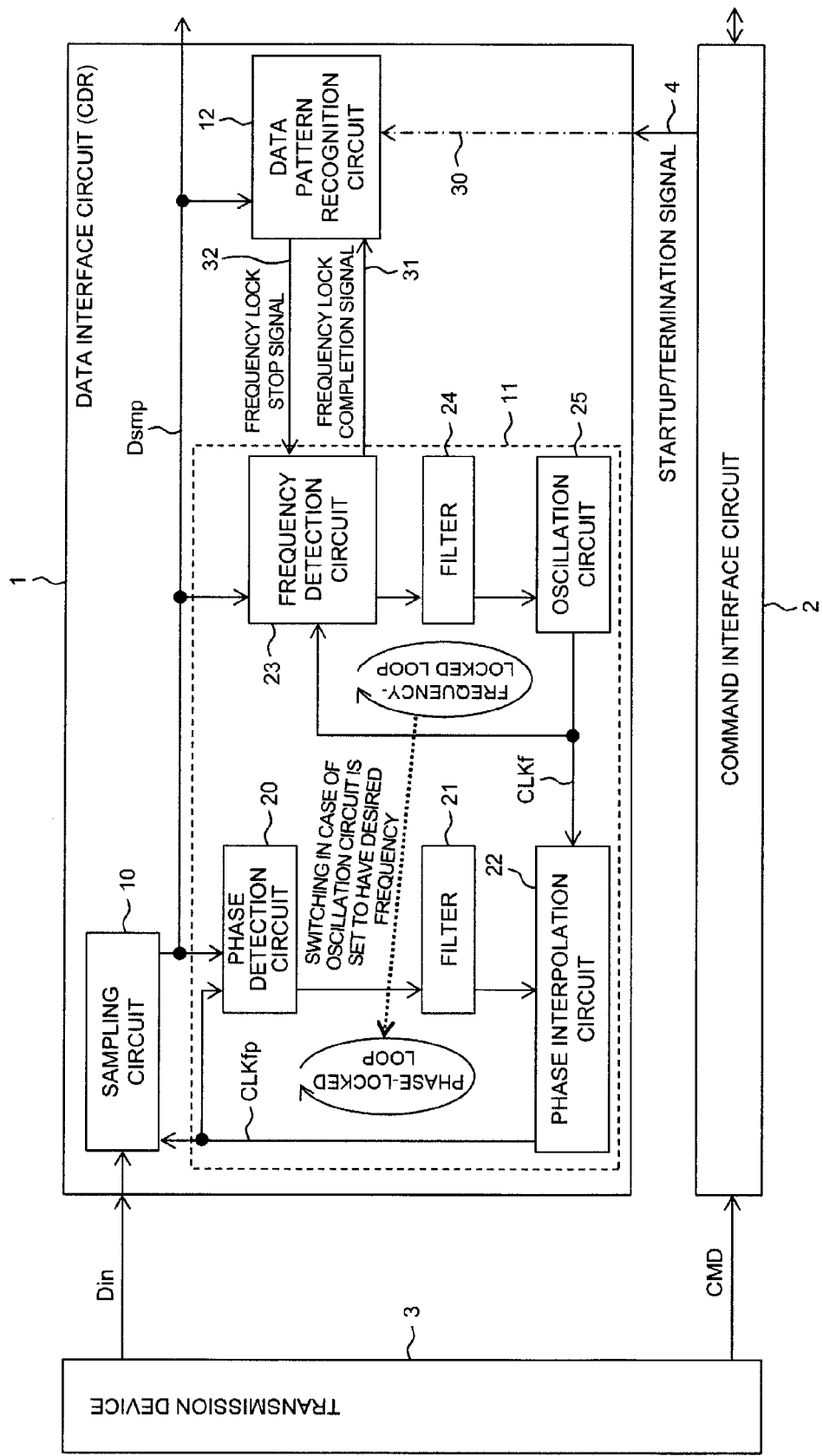
FIG. 1 is a block diagram illustrating an example of a CDR circuit which is applied to a data interface circuit.

In a CDR circuit, a clock signal is reproduced from transmission data, and data is received with the clock signal. In order to receive data through the CDR circuit, an oscillator included in the CDR circuit is oscillated at the same frequency as that of the clock signal embedded in the data. In order to make the frequency of the oscillator equal to that of the clock signal, a frequency lock operation may be performed using a specific data pattern. For example, when a data pattern for frequency lock is generated at a display port according to a video output interface standard for a digital display device (such as an LCD), an external reference clock signal in some cases is not provided to a display driving device in order to reduce the number of components on a PCB substrate or as an EMI countermeasure. In this case, frequency lock is performed using the data pattern for frequency lock.

Since a data transmission frequency is related to the resolution of a display, a data transmission frequency can be determined within any system. For this reason, a desired frequency of the oscillator can be known beforehand, but in cases where there is no reference clock signal, it may not be possible to perform oscillation at a desired frequency due to process variation, temperature conditions, or the like. For a frequency lock operation, a data pattern for frequency lock is transmitted from a data transmission device, and the frequency is detected in the CDR circuit and used to adjust the frequency of the oscillator.

The CDR circuit comprises a frequency-locked loop that performs frequency lock and a phase-locked loop that adjusts a clock phase in order to correctly fetch data. The frequency-locked loop operates during the execution of frequency lock, and operation of the phase-locked loop begins after the completion of frequency lock. The frequency lock can be started by issuing a command using a command interface from the data transmission device. However, where a frequency lock instruction command is issued from the display port or the like, the data pattern for frequency lock may or may not be transmitted.

When the data pattern for frequency lock is not transmitted during the execution of frequency lock, the frequency lock operation is performed using other patterns included in the data, and the detected frequency may be erroneous. Thereby, the frequency of the oscillator is not set to a desired frequency. JP-A-2012-44446 does not address this problem.

An object of the disclosure is to prevent frequency lock with an erroneous pattern in a synchronization circuit configured to use a predetermined pattern for frequency lock.

The above and other objects and novel features of the disclosure will be made clearer from the description and the accompanying drawings of the present specification.

The following is a brief description of the summary of the representative embodiments of the disclosure of the present application.

That is, a synchronization circuit that synchronizes the frequency of an oscillation clock signal from an oscillation circuit with the frequency of a predetermined pattern of input data waits for a data pattern recognition circuit detecting an input of the predetermined pattern in response to a frequency lock start instruction, and starts a frequency lock operation.

The following is a brief description of an effect obtained by the representative embodiments of the disclosure of the present application.

That is, it is possible to prevent frequency lock with an erroneous pattern in the synchronization circuit configured to use a predetermined pattern for frequency lock.

1. Summary of the Embodiments

First, a summary of representative embodiments of the disclosure will be described. Reference numerals included in parentheses and referred to in the summary of the representative embodiments are meant to denote components included in the concept of the components to which the reference numerals are designated.

[1] <Input of Specific Pattern is Detected to Start Frequency-Locked Operation>

A CDR circuit (1) includes a sampling circuit (10) that samples input data (Din), a synchronization circuit (11) that synchronizes a frequency of an oscillation clock signal (CLKfp) from an oscillation circuit (25) with a frequency of input data of a specific pattern which is sampled in the sampling circuit, and synchronizes a phase of the oscillation clock signal (CLKfp) with a phase of the sampled input data, and a data pattern recognition circuit (12) that detects whether the input data sampled in the sampling circuit has a specific pattern. The data pattern recognition circuit starts an operation for detecting whether the input data has a specific pattern in response to a frequency lock start instruction. The synchronization circuit starts an operation for synchronizing the frequency on condition that it is determined by the data pattern recognition circuit that the input data has a specific pattern.

According to this, it is possible to prevent frequency lock due to an erroneous pattern in the synchronization circuit using a specific pattern in frequency lock.

[2] <Oversampling>

In item 1, the sampling circuit oversamples input data of i-bit units with data of i×n-bit units at a frequency n times the oscillation clock signal.

According to this, it is possible to improve the detection accuracy of the specific pattern as well as the accuracy of frequency lock and phase synchronization compared with a case where oversampling is not performed.

[3] <Recognition Principle of Data Pattern Recognition Circuit>

In item 2, the data pattern recognition circuit detects a state where a predetermined logical value of a unit bit of input data is extended over 2n bits of oversampling data to thereby determine that the input data does not have a specific pattern, and determines that the input data has a specific pattern by the extended state not being detected.

According to this, a state where the predetermined logical value of the unit bit of the input data is extended by exceeding a range of the number of bits two times the multiple n of oversampling in the oversampling data means a state deviating from an expected state, and thus it is possible to contribute to the easy determination of a specific pattern.

[4] <Relationship Between Initial Frequency of Oscillation Circuit and Data Frequency of Specific Pattern>

In item 3, in case that input data is oversampled in the sampling circuit, an initial frequency of the oscillation clock signal is set to a frequency in a range in which the presence or absence of the extended state is able to be detected with respect to a frequency of a clock signal embedded in the specific pattern.

Thereby, it is possible to guarantee the effectiveness of a determination method of item 3 in terms of the initial frequency of the oscillation clock signal at the determination of the specific pattern.

[5] <1 and 0 Repetitive Specific Pattern>

In item 3, the specific pattern is a repetitive pattern of logical values 1 and 0. The sampling circuit is a circuit that performs two-times oversampling of n=2.

According to this, not only the detection accuracy of the specific pattern can be improved by a relatively simple circuit configuration, but also the accuracy of frequency lock and phase synchronization can be improved.

[6] <Discrimination Method>

In item 5, the data pattern recognition circuit determines that the input data does not have a specific pattern in case that a bit string of the input data which is oversampled includes four consecutive digits of 1 or 0 as an array other than an array of two consecutive digits of 0, two consecutive digits of 1, three consecutive digits of 0, three consecutive digits of 1, one digit of 0, or one digit of 1, and determines that the input data has a specific pattern in case that the four consecutive digits of 1 or 0 are not present.

According to this, a specific pattern can be detected by a relatively simple circuit configuration.

[7] <Specific Example of Data Pattern Recognition Circuit>

In item 6, the data pattern recognition circuit includes a plurality of first logic circuits (EOR) that input the oversampled input data in 2×i-bit units, and perform coincidence detection on contiguous data of the input 2×i-bit data and low-order 3 bits of 2×i bits which are input immediately before the data, in 2-bit units which are adjacent to each other, a plurality of second logic circuits (NOR) that determine whether being in a first state where coincidence detection results of three of the first logic circuits adjacent to each other are all coincident with each other, and a third logic circuit (OR) that determines whether being in a second state where at least one of the second logic circuits is set to be in the first state, and the third logic circuit stops a frequency-locked operation due to a determination result being the second state, and releases the stop of the frequency-locked operation due to a determination result not being the second state.

According to this, the data pattern recognition circuit can be relatively simply configured using the logic gate circuits that perform logic operations clock-asynchronously and statically.

[8] <Discriminable Frequency Conditions>

In item 6, in case that input data is oversampled in the sampling circuit, an initial frequency of the oscillation clock signal is set to a frequency in a range lower than 1.5 times and higher than 0.8 times a frequency of the specific pattern.

According to this, the periphery of the oscillation clock signal is specified as described above with respect to the frequency of a known specific pattern of a system, and thus it is possible to guarantee to reliability of the determination result in item 6 with a margin for the result.

[9] <Phase Synchronization Based on Phase Difference after Frequency Lock>

In item 1, the synchronization circuit performs phase synchronization through phase correction based on a phase difference between sampling data and an oscillation clock signal after frequency synchronization using the specific pattern is established.

According to this, it is possible to perform phase correction using a phase interpolation circuit.

[10] <Synchronization Circuit Using PLL>

In item 1, the synchronization circuit is constituted by a PLL circuit.

According to this, the synchronization of an oscillation frequency and a phase can be realized by phase comparison.

[11] <Interface Circuit and LSI>

A semiconductor device (62) includes an external interface circuit (51, 52) and a processing circuit (53 to 59) that processes data which is supplied to the external interface circuit. The external interface circuit is provided with the CDR circuit (1) according to item 1 as a circuit that inputs the data.

According to this, it is possible to contribute to an improvement in the reliability of a so-called clock embedded data interface in the semiconductor device.

[12] <Display Driving Device>

In item 11, the processing circuit inputs image data which is supplied to the CDR circuit, and outputs a gradation voltage corresponding to the input image data in pixel units in synchronization with a display timing.

According to this, in case that a data pattern for frequency lock is prepared in a display port or the like which is the standard of a video output interface, it is possible to prevent frequency lock from being performed erroneous in a data pattern by the specific data pattern for frequency lock being not issued simultaneously with the issue of a frequency lock command.

2. Further Detailed Description of the Embodiments

A further detailed description of the embodiments will be given below.

<CDR Circuit Including Data Pattern Recognition Circuit>

FIG. 1 illustrates an example of a CDR circuit. In FIG. 1, the CDR circuit is applied to a data interface circuit 1, and the data interface circuit is provided with a startup/termination signal 4 from a command interface circuit 2 and is instructed to perform an input operation. The supply of data to the data interface circuit 1 and the issue of a command to the command interface circuit 2 are performed by a transmission device 3 such as a host device.

The command interface circuit 2 outputs the startup/termination signal 4 to the data interface circuit 1 in accordance with a command CMD which is provided from the transmission device 3. Although not particularly limited, the command interface circuit 2 receives a frequency lock start command and instructs the data interface circuit 1 to perform a data input operation through the startup/termination signal 4.

The data interface circuit 1 includes a sampling circuit 10 that samples input data Din, a synchronization circuit 11 that generates a clock signal CLKfp obtained by synchronizing the frequency of an oscillation clock signal CLKf of an oscillation circuit 25 with the frequency of input data Din of a specific pattern sampled in the sampling circuit 10 and synchronizing the phase of the oscillation clock signal with the phase of the sampled input data Din, and a data pattern recognition circuit 12 that detects whether the input data Din sampled in the sampling circuit 10 has a specific pattern.

The sampling circuit 10 performs so-called two-times oversampling for sampling the input data Din at both the rising edge and the falling edge of the clock signal CLKfp. Dsmp is sampling data which is oversampled and output in the sampling circuit 10.

The synchronization circuit 11 is configured such that a frequency loop is formed by a frequency detection circuit 23, a filter 24, and the oscillation circuit 25, and that a phase loop is formed by a phase detection circuit 20, a filter 21, and a phase interpolation circuit 22.

The frequency detection circuit 23 detects a difference between the frequency of the input data Din and the frequency of the clock signal CLKf on the basis of the sampling data Dsmp having a specific pattern, for example, a 1 and 0 repetitive pattern and the clock signal CLKf, and generates a control voltage by removing a high frequency component through the filter 24 with respect to a signal corresponding to the frequency difference. The oscillation circuit 25 has the frequency thereof controlled in accordance with the control voltage. The oscillation circuit 25 has the oscillation frequency thereof loop-controlled so that the frequency of the clock signal CLKf comes close to the frequency of the input data Din. In a frequency lock operation of the clock signal CLKf based on such a frequency loop, an initial frequency of the oscillation frequency of the oscillation circuit 25 is set to a frequency corresponding to the frequency of the specific pattern of the input data Din, but an error occurs in practice due to environmental temperature, process variation or the like, and the error is eliminated by frequency lock.

After frequency lock, the phase detection circuit 20 detects a phase difference between the input data Din and the clock signal CLKfp on the basis of the sampling data Dsmp and the clock signal CLKfp (initially, the same as the clock signal CLKf), and generates a phase control timing signal by removing a high frequency component through the filter 21 from a signal corresponding to the phase difference. The phase interpolation circuit 22 controls phase lead/phase lag of the clock signal CLKfp for the phase of the clock signal CLKf in accordance with the phase control timing signal. The initial phase of the clock signal CLKfp which is output by the phase interpolation circuit 22 is the same as that of the clock signal CLKf, and the phase interpolation circuit 22 controls the phase-locked loop so that the phase of the clock signal CLKfp comes close to the phase of the input data Din. Although not particularly limited, the phase interpolation circuit 22 generates a multi-layer clock having the phase of the clock signal CLKf shifted by a predetermined degree, and the clock signal which is selected from the multi-layer clock is made variable in accordance with the timing signal which is output from the filter 21.

The data pattern recognition circuit 12 detects whether the input data Din has a specific pattern on the basis of the sampling data Dsmp sampled in the sampling circuit 10. The data pattern recognition circuit 12 starts an operation for detecting whether the input data Din has a specific pattern in response to an instruction for an input operation based on a frequency lock start instruction signal 30, that is, a startup/termination signal 4. For example, the frequency detection circuit 23 asserts a frequency lock completion signal 31 to the data pattern recognition circuit 12 by frequency lock completion. Thereby, the data pattern recognition circuit 12 asserts a frequency lock stop signal 32 to the frequency detection circuit 23, and the operation frequency detection circuit 23 is prevented from being started. The data pattern recognition circuit 12 is instructed to perform frequency lock start based on the signal 30 to thereby start a determination operation for an input pattern. Thereby, in case that the input of a specific pattern as the input data Din is detected, the frequency lock stop signal 32 is negated, and the frequency detection circuit 23 is instructed to perform operation start.

Figure 2:
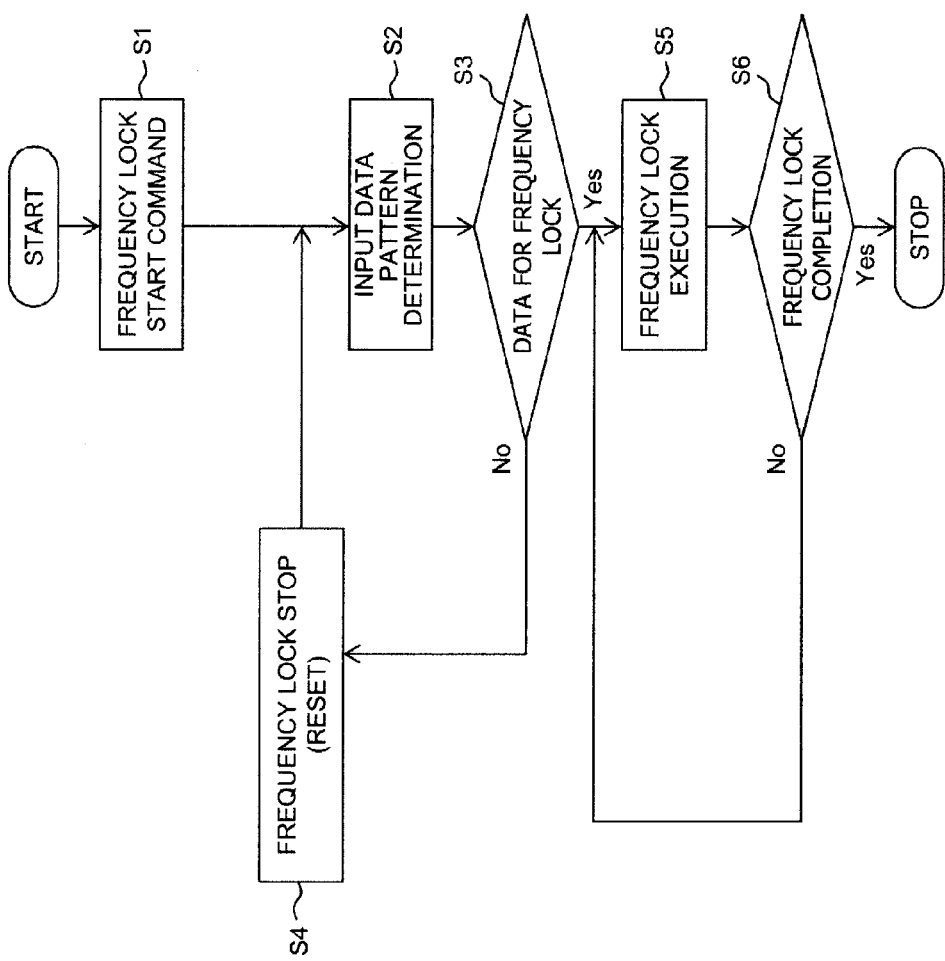
FIG. 2 is a flow diagram illustrating a frequency lock operation.

FIG. 2 illustrates a flow diagram of a frequency lock operation. In case that the command CMD for giving an instruction for frequency lock start is issued from the transmission device 3 (S1), the data pattern recognition circuit 12 which is instructed to perform operation start based on the signal 30 starts a pattern determination operation for the input data Din (S2). It is determined whether the pattern has a specific pattern, that is, is a data pattern for frequency lock (S3), the start of the frequency lock operation is prevented in case that the pattern is not a data pattern for frequency lock (S4), the frequency detection circuit 23 is instructed to start the frequency lock operation in case that the pattern is a data pattern for frequency lock (S5), the completion of the frequency lock operation is waited for (S6), and the frequency lock operation is terminated.

Figure 3:
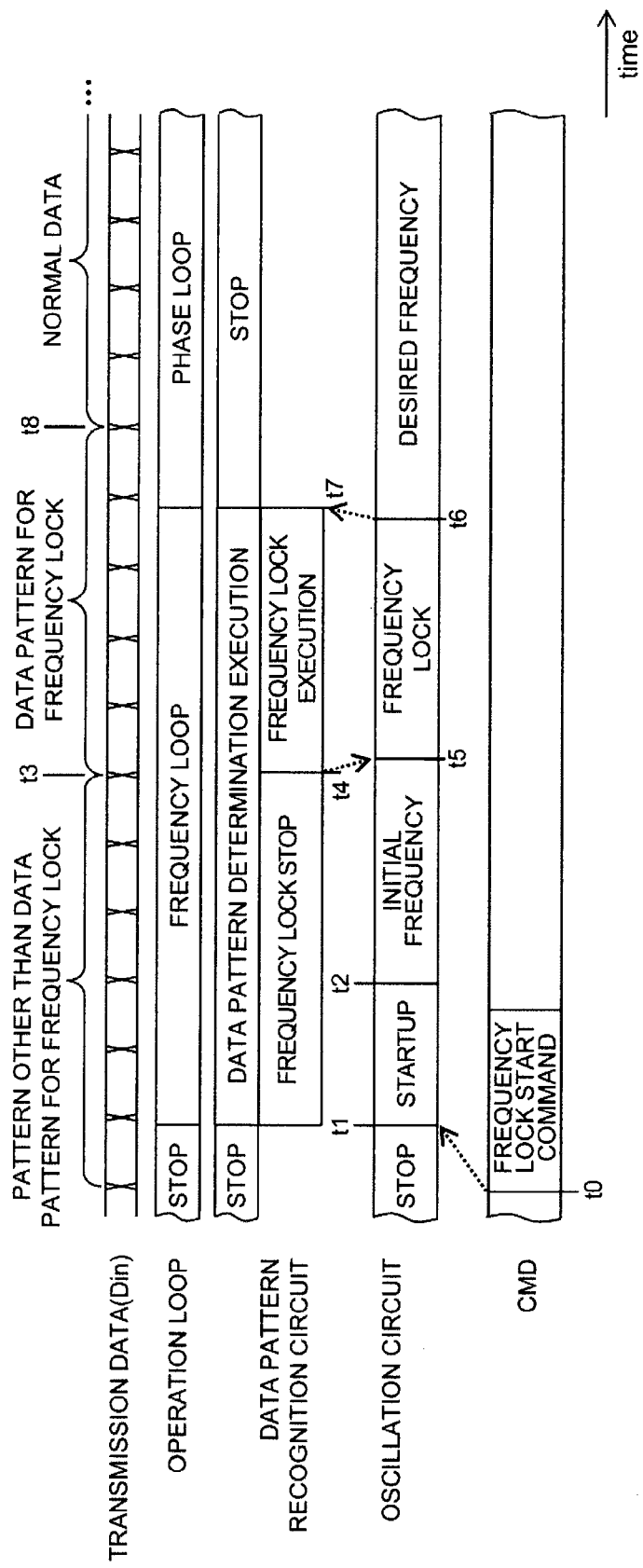
FIG. 3 is a timing diagram illustrating a synchronizing operation of CDR input data.
Figure 4:
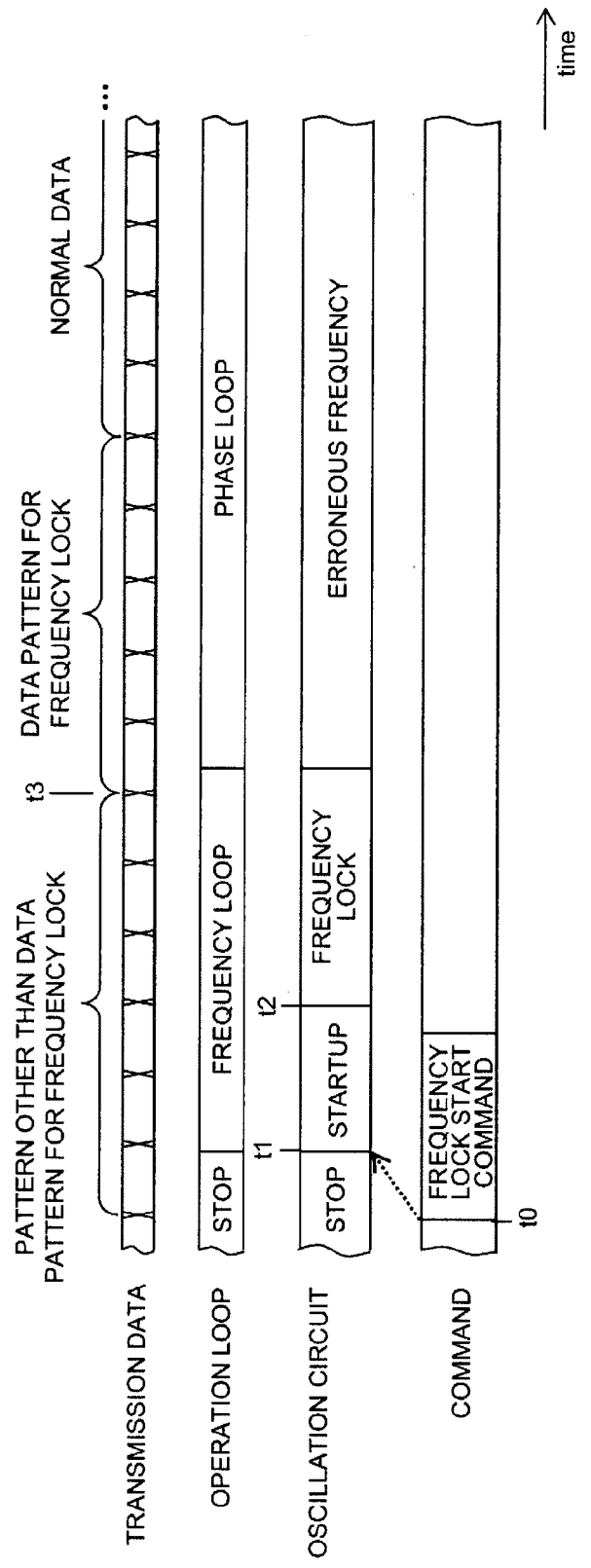
FIG. 4 is a timing diagram illustrating an operation in case that a data recognition circuit is not adopted, as a comparative example.

FIG. 3 illustrates a timing diagram of a synchronization operation of CDR input data. In case that a command for giving an instruction for frequency lock start is input at time t0, the oscillation circuit 25 is started up at time t1 in response thereto, an oscillation operation is stabilized at time t2 and the oscillation frequency is stabilized to an initial frequency. In addition, a pattern recognition operation in the data pattern recognition circuit 12 is started in response to the instruction for frequency lock start at time t0. In this stage, the frequency lock operation is not started. In case that the specific pattern for frequency lock is started to be input as the input data Din at time t3, the data pattern recognition circuit 12 determines the input of the specific pattern at time t4, and thus instructs the frequency detection circuit 23 to start the frequency lock operation. Thereby, the frequency lock operation using the specific pattern is started with respect to the clock signal CLKf which is transmitted by the oscillation circuit 15 (t5), and the frequency lock operation is completed at time t6. In synchronization therewith, the pattern recognition operation in the data pattern recognition circuit 12 is terminated at time t7, and a phase synchronizing operation is started with respect to the phase loop. In case that the input data Din is changed at time t8 from the specific pattern to normal data, the data is sampled in synchronization with the clock signal CLKfp which is appropriately phase-synchronized therewith, and is transferred to a subsequent stage. In case that the data recognition circuit 12 is not adopted, as illustrated in a timing diagram according to a comparative example of FIG. 4, the input of a command for giving an instruction for frequency lock start at time t0 causes the oscillation circuit 25 to be started up at time t1 in response thereto, and the stabilization of the oscillation operation at time t2 and the stabilization of the oscillation frequency to an initial frequency cause the frequency lock operation to be started even in case that the pattern of the input data Din is a pattern other than the specific pattern. Therefore, at time t3, in case that frequency lock has already been completed at that time even in case of the pattern of the input data Din being the specific pattern, phase lock has to be performed on the basis of an earliest erroneous frequency lock result, which results in the generation of an error in data fetching due to a clock regeneration error.

According to the above, it is possible to prevent frequency lock due to an erroneous pattern in the synchronization circuit using a specific pattern in frequency lock.

Since oversampling is used, it is possible to improve the detection accuracy of the specific pattern as well as the accuracy of frequency lock and phase synchronization compared with a case where oversampling is not performed.

<Specific Example of Data Pattern Recognition Circuit>

Figure 6:
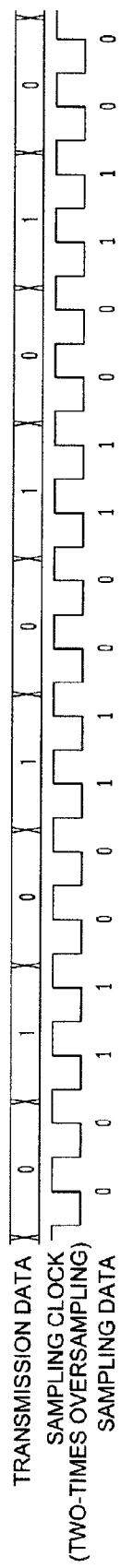
FIG. 6 is a diagram illustrating a data row which is obtained in case that a data frequency of input data Din and a frequency of a clock signal CLKfp from an oscillation circuit are coincident with each other.

A method of identifying a specific pattern in the data pattern recognition circuit 12 is based on the following principle. In case that a special data pattern having 1 and 0 for frequency lock repeated therein is sampled by two-times oversampling, one to three consecutive digits of 0 or 1 are included in a data row to be obtained. That is, in case that the data frequency of the input data Din and the frequency of the clock signal CLKfp from the oscillation circuit 25 are coincident with each other, a data row to be obtained has two consecutive digits of 0 and two consecutive digits of 1 repeated therein as shown in FIG. 6.

Figure 7:
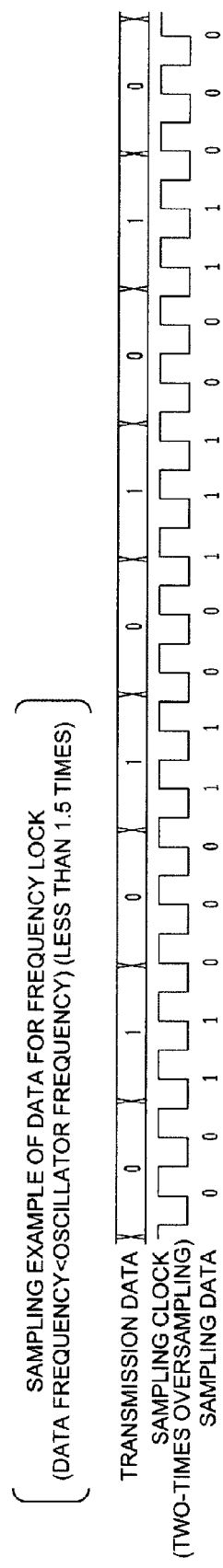
FIG. 7 is a diagram illustrating a data row which is obtained in case that the frequency of the clock signal CLKfp from the oscillation circuit is higher than the data frequency of the input data Din.

On the other hand, in case that the frequency of the clock signal CLKfp from the oscillation circuit 25 is higher than the data frequency of the input data Din, a data row to be obtained has two consecutive digits of or three consecutive digits of 0 or 1 repeated therein, as illustrated in FIG. 7.

Figure 8:
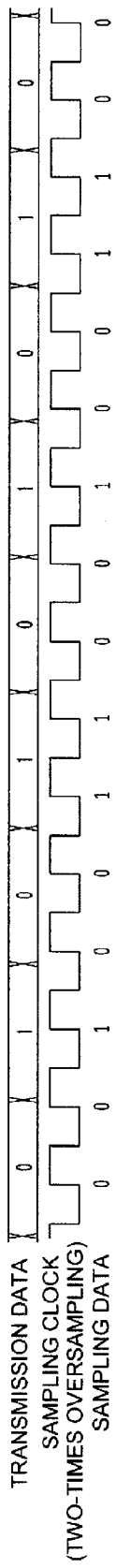
FIG. 8 is a diagram illustrating a data row which is obtained in case that the frequency of the clock signal CLKfp from the oscillation circuit is lower than the data frequency of the input data Din.

On the other hand, in case that the frequency of the clock signal CLKfp from the oscillation circuit 25 is lower than the data frequency of the input data Din, a data row to be obtained has one digit of or two consecutive digits of 0 or 1 repeated therein, as illustrated in FIG. 8.

Figure 9:
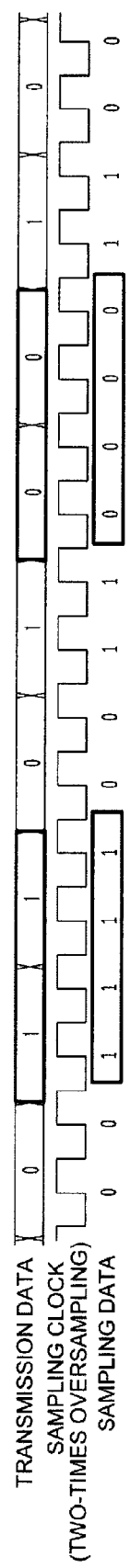
FIG. 9 is a diagram illustrating a data row which is obtained in case that the data frequency of the input data Din and the frequency of the clock signal CLKfp from the oscillation circuit are coincident with each other in case that a pattern other than a data pattern for frequency lock is sampled by two-times oversampling.
Figure 10:
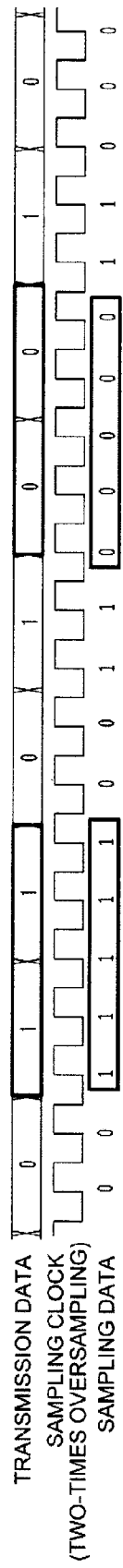
FIG. 10 is a diagram illustrating a data row which is obtained in case that the frequency of the clock signal CLKfp from the oscillation circuit is higher than the data frequency of the input data Din in case that a pattern other than a data pattern for frequency lock is sampled by two-times oversampling.
Figure 11:
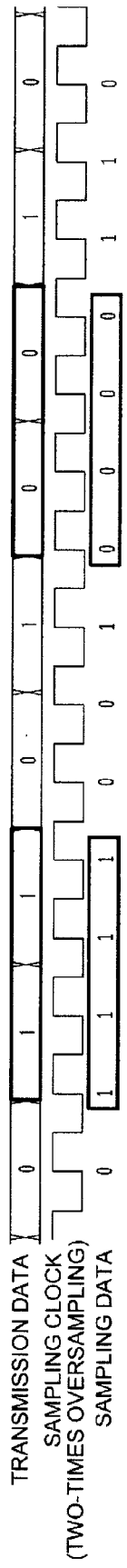
FIG. 11 is a diagram illustrating a data row which is obtained in case that the frequency of the clock signal CLKfp from an oscillation circuit is lower than the data frequency of the input data Din in case that a pattern other than a data pattern for frequency lock is sampled by two-times oversampling.

In any of a case where a pattern other than the data pattern for frequency lock is sampled by two-times oversampling, a case where the data frequency of the input data Din and the frequency of the clock signal CLKfp from the oscillation circuit 25 are coincident with each other (FIG. 9), a case where the frequency of the clock signal CLKfp from the oscillation circuit 25 is higher than the data frequency of the input data Din (FIG. 10), and a case where the frequency of the clock signal CLKfp from the oscillation circuit 25 is lower than the data frequency of the input data Din (FIG. 11), a data row to be obtained includes a location having four or more consecutive digits of 0 or 1.

Therefore, the data pattern recognition circuit 12 determines that the input data does not have a specific pattern in case that the bit string of the sampling data which is oversampled includes four consecutive digits of 1 or 0 as an array other than an array of two consecutive digits of 0, two consecutive digits of 1, three consecutive digits of 0, three consecutive digits of 1, one digit of 0, or one digit of 1, and determines that the input data has a specific pattern in case that the four consecutive digits of 1 or 0 are not present.

Further, in order to correctly recognize the data pattern, it is necessary that the data frequency of the input data Din and the frequency of the clock signal CLKfp from the oscillation circuit 25 satisfy the following relational expression. That is, in case that the input data is oversampled by the sampling circuit, an initial frequency of the oscillation clock signal CLKfp is set to a frequency in a range lower than 1.5 times and higher than 0.8 times the frequency of the specific pattern.

Figure 12:
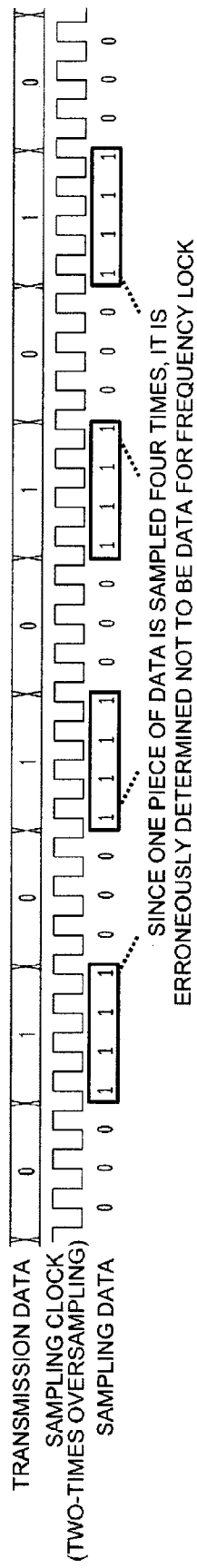
FIG. 12 is a diagram illustrating a data row which is obtained in case that an initial frequency of the oscillation clock signal CLKfp from the oscillation circuit is higher than 1.5 times the frequency of the input data Din.
Figure 13:
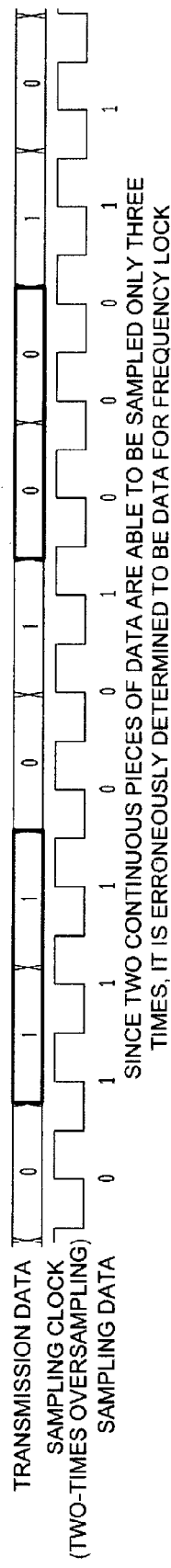
FIG. 13 is a diagram illustrating a data row which is obtained in case that the initial frequency of the oscillation clock signal CLKfp from the oscillation circuit is lower than 0.8 times the frequency of the input data Din.

In case that the initial frequency of the oscillation clock signal CLKfp from the oscillation circuit 25 is higher than 1.5 times the frequency of the input data Din, there is the possibility of data for frequency lock being erroneously determined not to be data for frequency lock as illustrated in FIG. 12. On the other hand, incase that the initial frequency of the oscillation clock signal CLKfp from the oscillation circuit 25 is lower than 0.8 times the frequency of the input data Din, there is the possibility of a data pattern which is not data for frequency lock being erroneously determined to be data for frequency lock as illustrated in FIG. 13. The multiples of 1.5 times and 0.8 times are an example in a relationship between an oversampling multiple and a clock identification method, and there is no limitation thereto.

The initial frequency of the oscillation clock signal CLKfp from the oscillation circuit 25 is adjusted in advance so as to be in a range in which the erroneous determination does not occur. The initial frequency can also be configured to be capable of being programmably set in a predetermined range using a register parameter or the like.

Since the repetitive pattern of 1 and 0 is used in the specific pattern, not only the detection accuracy of the specific pattern can be improved by a relatively simple circuit configuration, but also the accuracy of frequency lock and phase synchronization can be improved.

It is determined that the input data does not have a specific pattern in case that four consecutive digits of 1 or 0 are present, and it is determined that the input data has a specific pattern in case that the four consecutive digits of 1 or 0 are not present, whereby the specific pattern can be detected by a relatively simple circuit configuration.

Figure 5:
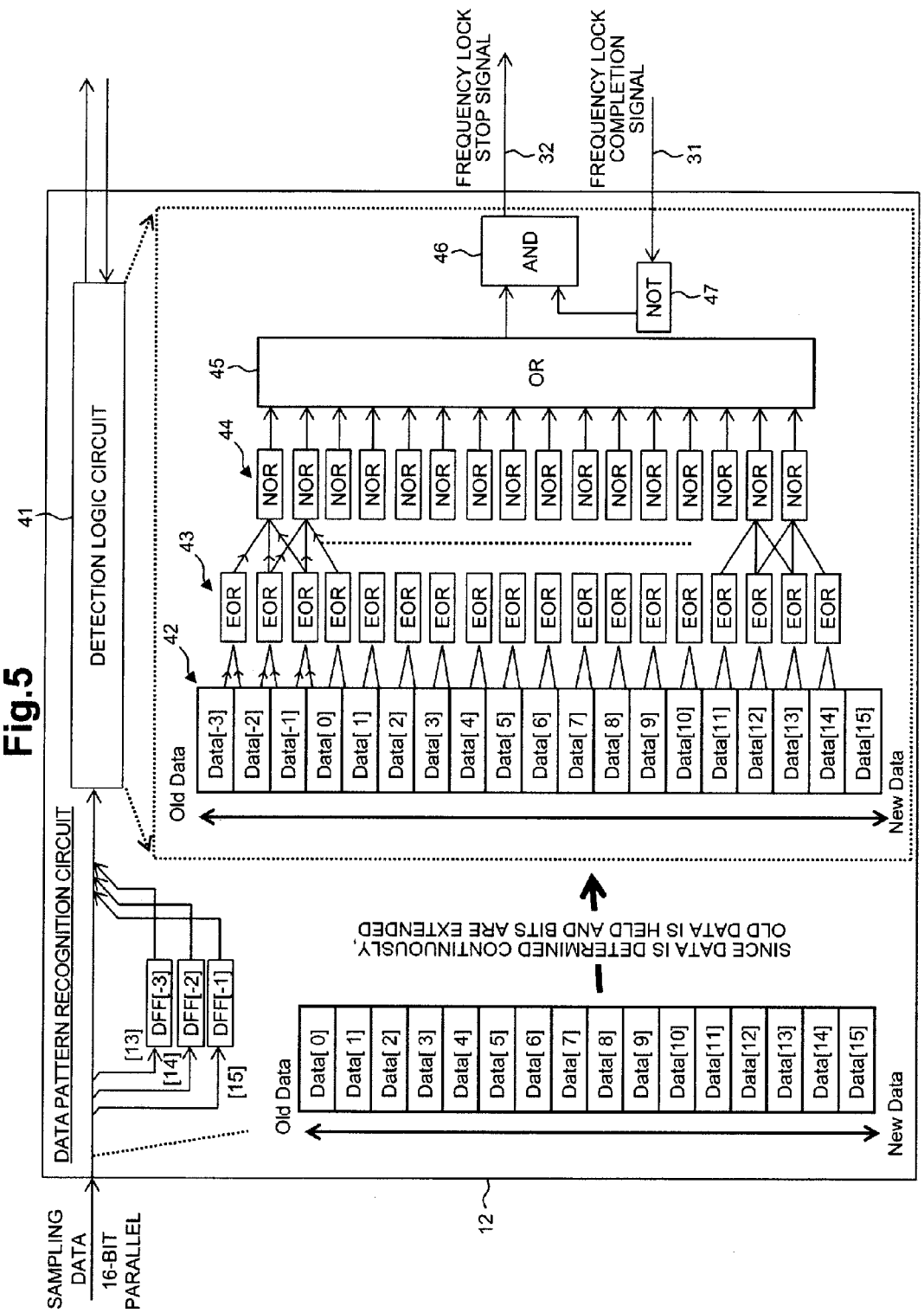
FIG. 5 is a logic circuit diagram illustrating a specific example of a data pattern recognition circuit.

FIG. 5 illustrates a specific example of the data pattern recognition circuit 12. The input data Din of a specific pattern is a repetitive pattern of 1 and 0. For example, sampling data on which two-times oversampling is performed on 8-bit input data Din is binarized by a rise in a clock signal CLKfp with respect to each bit of the 8-bit input data Din, and is extended to 16 bits. The configuration of FIG. 5 is not particularly limited, and is assumed to be configured such that the input data Din is parallel-input in 16-bit units which are over-sampled two times in 8-bit units. Sampling data which is input in 16-bit units is set to Data [0] to Data [15]. The input stage of the sampling data Dsmp is provided with delay latch circuits DFF [−3] to DFF [−1] corresponding to low-order 3-bit Data [13] to Data [15], and a detection logic circuit 41 inputs 19-bit contiguous data of the input 16-bit data Data [0] to Data [15] and the low-order 3 bits Data [13] to Data [15] (Data [−3] to Data [−1]) of 16 bits which are input immediately before the data.

The detection logic circuit 41 includes an input latch circuit 42 that inputs the 19-bit contiguous data, an EOR circuit array 43, a NOR circuit array 44, an OR circuit 45, an AND circuit 46, and a NOT circuit 47. The EOR circuit array 43 includes a plurality of exclusive logical addition gates EOR as a plurality of first logic circuits that perform coincidence detection in 2-bit units adjacent to each other in the input latch circuit 42. The NOR circuit array 44 includes a plurality of negative logical addition gates NOR as a plurality of second logic circuits that determine whether being in a first state where coincidence detection results of three of the exclusive logical addition gates EOR adjacent to each other are all coincident with each other. The OR circuit 45 is a logical addition gate OR as a third logic circuit that determines whether being in a second state where at least one of the negative logical addition gates NOR is set to be in the first state.

In order to detect four consecutive digits of 1 or four consecutive digits of 0, the respective continuous 2-bit exclusive logical additions are first performed, and both four consecutive digits of 1 and four consecutive digits of 0 are replaced by three consecutive digits of 0 outputs of the exclusive logical addition gate EOR. In this manner, negative logical addition is performed on the outputs of three exclusive logical addition gates EOR which are adjacent to each other, thereby allowing three consecutive digits of 0 to be detected. In case that one or more continuous bit strings (that is, those which are not data for frequency lock) are included in 8 bits of the input data Din of the CDR circuit 1 by collecting the outputs of all the negative logical addition gates NOR to perform logical addition using the logical addition gate OR, these strings can be detected. Therefore, the logical multiplication gate (AND) 46 stops a frequency-locked operation using the frequency stop signal 32 as assertion of a high level through the high level output of the OR circuit 45, and releases the stop of the frequency-locked operation using the frequency stop signal 32 as negation of a low level through the low level output of the OR circuit 45.

According to this, the data pattern recognition circuit 12 can be relatively simply configured using the logic gate circuits 43 to 45 that perform logic operations clock-asynchronously and statically.

Figure 14:
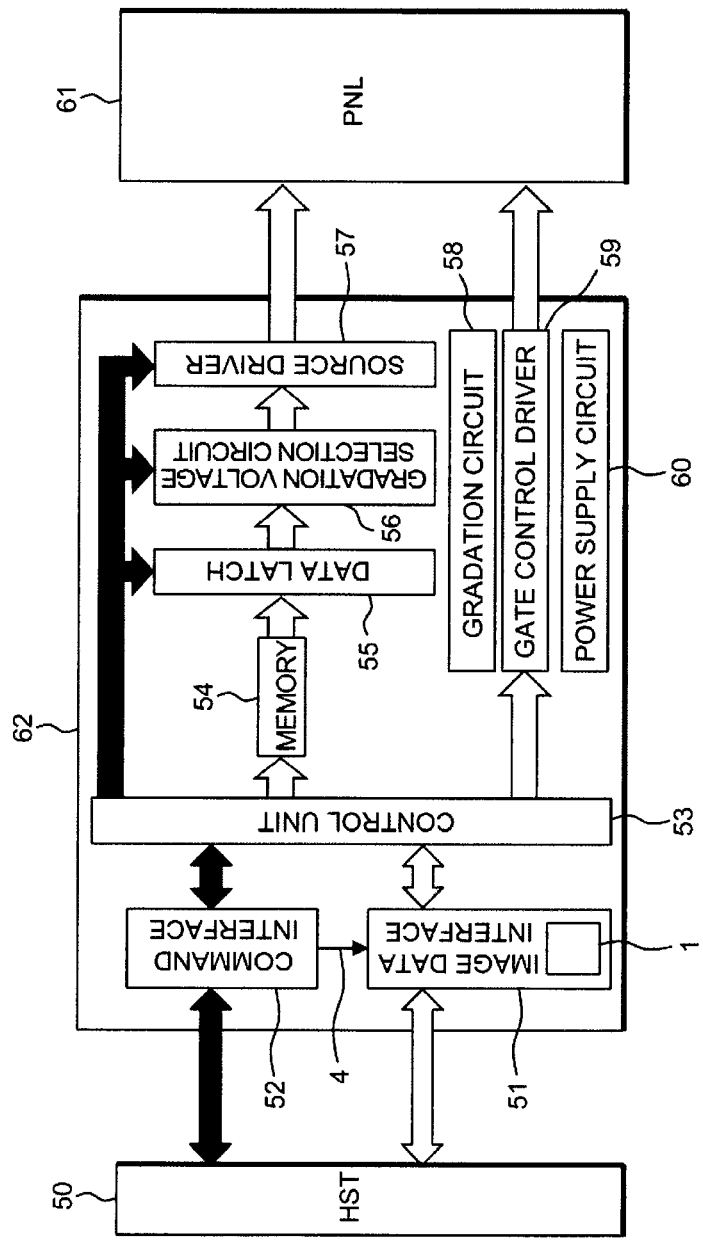
FIG. 14 is a block diagram illustrating a liquid crystal driver which is an example of a semiconductor device having the CDR circuit included in an external interface circuit.

FIG. 14 illustrates a liquid crystal driver as an example of a semiconductor device having the CDR circuit included in an external interface circuit. A liquid crystal driver 62 includes a command interface circuit 52 and an image data interface circuit 51, as external interface circuits which are connected to a host device (HST) 50. A command is supplied from the host device 50 through the command interface circuit 52, and display data is supplied therefrom through the image data interface 51. The CDR circuit 1 is applied to the image data interface 51, and constitutes a so-called clock embedded data interface. Processing circuits that process the command which is supplied to the command interface circuit 52 and the image data which is supplied to the image data interface circuit 51 include a control unit 53, a memory 54, a data latch 55, a gradation voltage selection circuit 56, a source driver 57, a gradation circuit 58, and a gate control driver 59. The control unit 53 controls the inside of the driver using decoded results of the supplied command and a command parameter, and stores the supplied display data in the memory 54. The gradation circuit 58 generates a plurality of gradation voltages and provides the generated voltages to the gradation voltage selection circuit 56. The control unit 53 sequentially selects and drives gate lines of a liquid crystal display panel (PNL) 61 in synchronization with a horizontal scanning period for each display frame using the gate control driver 59 in a display operation. In addition, the control unit 53 transfers one gate line's worth of display data (display line data) from the memory 54 to the data latch 55 in synchronization with the horizontal scanning period, and the gradation voltage selection circuit 56 selects a gradation voltage in pixel units of the data using the transferred display line data. The selected gradation voltage is supplied to a plurality of driving amplifiers constituting the source driver 57. The plurality of driving amplifiers drive a plurality of source lines SL of the liquid crystal display panel 61 in a parallel manner in units of display line data. A circuit block denoted by 60 is a power supply circuit.

Since the CDR circuit 1 is applied to the image data interface 51, it is possible to improve the reliability of a so-called clock embedded data interface in the liquid crystal driver 62. In case that a data pattern for frequency lock is prepared in a display port or the like which is the standard of a video output interface, it is possible to prevent frequency lock from being performed in an erroneous data pattern by the specific data pattern for frequency lock not being issued simultaneously with the issue of a frequency lock command.

As described above, while the disclosure is described specifically based on the embodiments thereof, the disclosure is not limited to the embodiments, and it goes without saying that various changes and modifications may be made without departing from the scope of the disclosure.

For example, the multiple of oversampling may be 4 times, 8 times or the like without being limited to two times, but power consumption increases as the multiple increases. A method of identifying a specific data pattern for frequency lock may be appropriately changed in accordance with the multiple of oversampling. In addition, a relationship between the initial frequency of the oscillation circuit and the data frequency of the specific pattern during frequency lock may also be appropriately changed in accordance with the multiple.

The specific pattern for frequency lock can also be appropriately changed without being limited to a repetitive pattern of 1 and 0.

In addition, the above configuration is not limited to a configuration in which the frequency-locked loop and the phase-locked loop are separately included for the synchronization of frequency and phase, as described above, and phase synchronization is performed by phase correction (phase interpolation) based on a phase difference between the sampling data and the oscillation clock signal after frequency synchronization using a specific pattern is established. A configuration may be used in which the PLL circuit is used for the synchronization of frequency and phase, that is, a configuration in which the phase of a clock based on a voltage control oscillation circuit is synchronized with the phase of input data in accordance with phase comparison results.

The disclosure can be widely applied to a clock embedded interface, and can be widely applied to a system in which a frequency on the receiving device side is locked using a data pattern for frequency lock.

What is claimed is:

1. A clock data recovery (CDR) circuit comprising:
a sampling circuit configured to sample input data synchronized with a clock signal;
a data pattern recognition circuit configured to determine, upon receiving a frequency lock start instruction, whether the sampled input data includes a predetermined pattern; and
a synchronization circuit configured to:
synchronize a frequency of an oscillation clock signal with a frequency of the sampled input data that includes the predetermined pattern, and
generate the clock signal to synchronize a phase of the oscillation clock signal with a phase of the sampled input data.

2. The CDR circuit according to claim 1, wherein the sampling circuit is configured to oversample the input data of i-bit units with data of (i times n)-bit units at a frequency n times the frequency of the oscillation clock signal,
wherein i represents an integer value≥1 and n represents a real number value>1.

3. The CDR circuit according to claim 2, wherein the data pattern recognition circuit is further configured to detect a condition where a predetermined logical value of a unit bit of the input data extends for 2n bits of the oversampled input data,
wherein the sampled input data does not include the predetermined pattern when the condition is detected, and
wherein the sampled input data includes the predetermined pattern when the condition is not detected.

4. The CDR circuit according to claim 3, wherein an initial frequency of the oscillation clock signal is set within a frequency range in which the presence or absence of the condition is detectable based on a frequency of a clock signal embedded in the predetermined pattern.

5. The CDR circuit according to claim 3, wherein the predetermined pattern is an alternating pattern of logical values 1 and 0, and wherein the sampling circuit is configured to perform two-times oversampling corresponding to n=2.

6. The CDR circuit according to claim 5, wherein the data pattern recognition circuit is configured to detect the condition when a bit string of the oversampled input data includes four consecutive logical 1 digits or four consecutive logical 0 digits, and to detect an absence of the condition when the four consecutive logical 1 digits and the four consecutive logical 0 digits are not present.

7. The CDR circuit according to claim 6, wherein the data pattern recognition circuit includes:
 first logic circuitry comprising a plurality of first logic gates and configured to:
  receive the oversampled input data in (2 times i)-bit units, and
  perform coincidence detection on contiguous oversampled input data, wherein the contiguous oversampled input data includes a current received unit of (2 times i)-bit data and a low-order 3 bits of a previously received unit of (2 times i)-bit data,
  wherein the coincidence detection is performed by the plurality of first logic gates on each adjacent 2-bit unit of the contiguous oversampled input data;
 second logic circuitry comprising a plurality of second logic gates configured to indicate a first state in which three of the plurality of first logic gates indicate the coincidence of three consecutive adjacent 2-bit units; and
 third logic circuitry configured to indicate a second state when at least one of the second logic gates indicates the first state,
 wherein the data pattern recognition circuit is further configured to stop the synchronization circuit from performing a frequency lock operation based on whether the third logic circuitry indicates the second state.

8. The CDR circuit according to claim 7, wherein the plurality of first logic gates includes a plurality of exclusive OR (EOR, XOR) gates, wherein the plurality of second logic gates comprises a plurality of NOR gates coupled with the outputs of the plurality of the EOR gates, and wherein the third logic circuitry includes at least one OR gate coupled with the outputs of the plurality of NOR gates.

9. The CDR circuit according to claim 7, wherein the data pattern recognition circuit further includes fourth logic circuitry configured to assert a frequency lock stop signal to the synchronization circuit when:
 the third logic circuitry indicates the second state, and
 the synchronization circuit is not asserting a frequency lock completion signal.

10. The CDR circuit according to claim 6, wherein the sampling circuit is configured to perform two-times oversampling corresponding to n=2, and wherein the initial frequency of the oscillation clock signal is set to within a frequency range of greater than 0.8 times and less than 1.5 times the frequency of a clock signal embedded in the predetermined pattern.

11. The CDR circuit according to claim 1, wherein the synchronization circuit is configured to perform phase synchronization after frequency synchronization with the predetermined pattern has been achieved.

12. The CDR circuit according to claim 1, wherein the synchronization circuit comprises phase-locked loop (PLL) circuitry.

13. A semiconductor device comprising:
 external interface circuitry configured to receive input data from a transmission device, the external interface circuitry including a clock data recovery (CDR) circuit comprising:
  a sampling circuit configured to sample the received input data synchronized with a clock signal;
  a data pattern recognition circuit configured to determine, upon receiving a frequency lock start instruction, whether the sampled input data includes a predetermined pattern; and
  a synchronization circuit configured to:
   synchronize a frequency of an oscillation clock signal with a frequency of the sampled input data that is determined by the data pattern recognition circuit to include the predetermined pattern, and
   generate the clock signal to synchronize a phase of the oscillation clock signal with a phase of the sampled input data; and
 processing circuitry configured to process the received input data.

14. The semiconductor device according to claim 13, wherein the transmission device comprises a host device, wherein the external interface circuitry is configured to receive image data from the host device, and wherein the processing circuitry comprises:
 gradation circuitry configured to generate a plurality of gradation voltages corresponding to the received image data,
 wherein the processing circuitry is further configured to drive a display panel using the plurality of gradation voltages in synchronization with a display timing of the display panel.

15. A method of performing clock data recovery for received input data, the method comprising:
 sampling the received input data synchronized with a clock signal;
 determining, upon receiving an instruction to begin frequency synchronization, whether the sampled input data includes a predetermined pattern;
 synchronizing a frequency of an oscillation clock signal with a frequency of the sampled input data that includes the predetermined pattern; and
 generating the clock signal to synchronize a phase of the oscillation clock signal with a phase of the sampled input data.

16. The method of claim 15, wherein sampling the received input data comprises oversampling the received input data at a frequency n times the frequency of the received oscillation clock signal,
 wherein n represents a real number value>1.

17. The method of claim 16, wherein determining whether the sampled input data includes the predetermined pattern comprises detecting whether a predetermined logical value of a unit bit of the input data extends for 2n bits of the oversampled input data.

18. The method of claim 17,
 wherein sampling the received input data comprises two-times oversampling the received input data,
 wherein the predetermined pattern is an alternating pattern of logical values 1 and 0, and
 wherein determining whether the sampled input data includes the predetermined pattern comprises determining whether a bit string of the oversampled input data includes four consecutive logical 1 digits or four consecutive logical 0 digits.

19. The method of claim 15, further comprising selecting an initial frequency of the oscillation clock signal such that the predetermined pattern is detectable based on the frequency of the sampled input data.

20. The method of claim 19, wherein sampling the received input data comprises two-times oversampling the received input data, and wherein the initial frequency of the oscillation clock signal is selected from within a frequency range of greater than 0.8 times and less than 1.5 times the frequency of the sampled input data.

* * * * *